(12) United States Patent
Mariani et al.

(10) Patent No.: US 7,163,898 B2
(45) Date of Patent: Jan. 16, 2007

(54) METHOD FOR MANUFACTURING SEMICONDUCTOR INTEGRATED CIRCUIT STRUCTURES

(75) Inventors: Marcello Mariani, Carnate (IT); Lorena Beghin, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 350 days.

(21) Appl. No.: 10/631,463

(22) Filed: Jul. 30, 2003

(65) Prior Publication Data
US 2004/0132292 A1    Jul. 8, 2004

(30) Foreign Application Priority Data
Jul. 31, 2002   (EP)   ................... 02425505

(51) Int. Cl.
*H01L 21/302*   (2006.01)
(52) U.S. Cl. ............... 438/717; 438/257; 438/265; 438/706
(58) Field of Classification Search ............... 438/253, 438/262, 706, 710, 712, 720, 717, 257, 265; 430/312
See application file for complete search history.

(56) References Cited

U.S. PATENT DOCUMENTS

| | | | |
|---|---|---|---|
| 5,358,893 A * | 10/1994 | Yang et al. ............... 438/448 |
| 5,893,748 A | 4/1999 | Lin ............................ 438/618 |
| 5,998,287 A * | 12/1999 | Huang ........................ 438/587 |
| 6,242,795 B1 | 6/2001 | Chang ........................ 257/629 |
| 6,670,260 B1 * | 12/2003 | Yu et al. ..................... 438/526 |
| 2001/0015454 A1 * | 8/2001 | Lee et al. ................... 257/315 |
| 2001/0041309 A1 | 11/2001 | Kim et al. .................. 430/313 |

\* cited by examiner

*Primary Examiner*—Lan Vinh
(74) *Attorney, Agent, or Firm*—Lisa K. Jorgenson; Robert Iannucci; Seed IP Law Group PLLC

(57) ABSTRACT

A method for manufacturing circuit structures integrated in a semiconductor substrate that includes regions, in particular isolation regions, includes the steps of:—depositing a conductive layer to be patterned onto the semiconductor substrate;—forming a first mask of a first material on the conductive layer;—forming a second mask made of a second material that is different from the first and provided with first openings of a first size having spacers formed on their sidewalls to uncover portions of the first mask having a second width which is smaller than the first;—partly etching away the conductive layer through the first and second masks such to leave grooves of the second width;—removing the second mask and the spacers; and—etching the grooves through the first mask to uncover the regions provided in the substrate and form conductive lines.

36 Claims, 5 Drawing Sheets

METHOD FOR MANUFACTURING SEMICONDUCTOR INTEGRATED CIRCUIT STRUCTURES

BACKGROUND OF THE INVENTION

1. Field of the Invention

The present invention relates to a method for manufacturing circuit structures integrated in a semiconductor substrate, in particular lines of a conductive material in sub-micron circuit structures.

Specifically, the invention relates to a method for manufacturing circuit structures integrated in a semiconductor substrate, comprising isolation regions, the method comprising the steps of:

depositing a conductive layer to be patterned onto said semiconductor substrate.

Particularly but not limited to, the invention relates to a method of forming lines of a conductive material on a semiconductor substrate, wherein the line spacing is closer than that allowed by conventional photolithography techniques and continuously variable. The following description makes reference to this application field for convenience of explanation only.

2. Description of the Related Art

As it is well known, transferring patterns that have been defined in a light-sensitive layer (mask) to one or more layers beneath is a basic technical step in the integrated circuit fabricating process.

Also known is that the microelectronics industry has long been pursuing a reduction in the size of the several circuit structures that comprise an integrated circuit.

A first prior solution to the problem of bringing the spacing of structures patterned on silicon down to a value below that allowed by conventional photolithography techniques is based on the controlled oxidation of a silicon oxide mask, used for patterning a layer beneath.

Although this first solution is advantageous under different points of view, it presents several shortcomings. This solution comes out to be particularly crucial if structures of a conductive material, such as conductive lines, are to be formed. This because the realization of the silicon oxide mask, while effectively achieving a high mask-to-conductive material selectivity, often harms the interfacing oxide layers as the mask is removed.

Alternately, the use of conductive or "hybrid" materials such as polysilicon, silicon nitride ($Si_3N_4$), silicon oxynitride (SiON), or silicide layers employed to realize the mask, guarantees the integrity of the beneath oxide layers, but it does not allow to optimize the mask-to-conductive material selectivity.

In other words, when plasma etching is used, as is conventional practice in order to pattern conductive material layers, the mask employed for layer patterning wears out too much during the etching process. On the other hand, a highly selective etch is does not assure vertical profile where the thickness of the materials exceeds limiting values.

A second prior solution to realize closely spaced lines of a conductive material provides for spacers to be formed along the lithographic mask sides for narrower gaps between the conductor material lines.

Although achieving this objective, not even this solution is devoid of shortcomings, mainly because such spacers on a photoresist mask introduce problems due to the material of the spacers that are incompatible with the light-sensitive resin.

Thus, neither of the above prior solutions are really suitable to pattern specific structures such as the floating gate regions of a flash memory, for example, where polysilicon lines need to be provided with vertical profiles on substrates in which isolation regions or thin interfacing oxide layers are realized.

The underlying technical problem of the present invention is to provide a method of forming lines of a conductive material in integrated circuits, which method has suitable structural features such to allow the lines of conductive material to be formed very closed to each other, without damaging any structures previously formed in the layers beneath, thereby to overcome the shortcomings of manufacturing methods according to the prior art.

BRIEF SUMMARY OF THE INVENTION

An embodiment of this invention uses two successive masks made of different dielectric materials in order to define closely spaced lines of a conductive material. Advantageously, the embodiment comprises forming spacers along the sidewalls of the first mask.

The features and advantages of the method according to the invention should become apparent from the following description of an embodiment thereof, given by way of non-limitative example with reference to the accompanying drawings.

DETAILED DESCRIPTION OF THE INVENTION

The process steps described here below do not form a complete an integrated circuit. This invention can be implemented, along with current integrated circuit manufacturing techniques, and only such commonly used process steps necessary to understand this invention are included in the description.

The figures representing cross-sectional views taken through portions of an integrated circuit undergoing fabrication are not drawn to scale, but rather to highlight major features of the invention.

With reference to such figures, a method for manufacturing integrated circuits on a semiconductor substrate, in particular a method for forming lines of a conductive material in sub-micron circuit structures, is shown.

Figure 1:
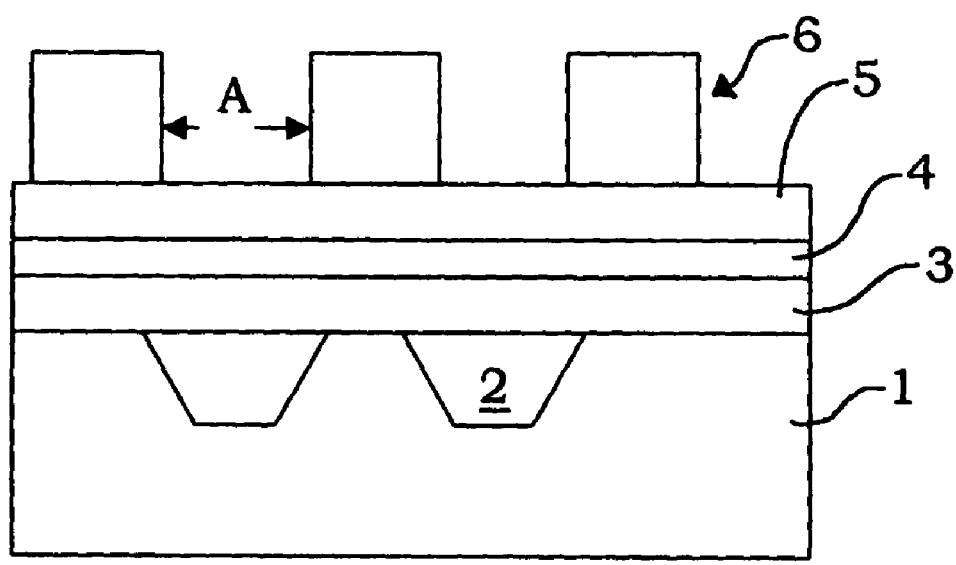
FIGS. 1 to 8 are schematic cross-section views of a portion of circuit integrated during different steps of the manufacturing method according to the invention.

Shown best in FIG. 1 is a semiconductor substrate 1 including an isolation region 2 that is for example oxide.

This region is provided in the semiconductor substrate 1 as shown, or is formed thereon as an insulative layer, for example.

A conductive layer 3, for example of polycrystalline silicon, a first protective layer 4, for example of silicon nitride, and a second protective layer 5, for example of oxide, are formed on the semiconductor substrate 1 in this order.

In particular, the conductive layer 3 and second protective layer 5 are highly selectively etchable to each other, whereas the selectivity of the first protective layer 4 lies in between.

A photoresist layer 6 is then deposited onto the second protective layer 5. Using conventional lithographic techniques, the photoresist layer 6 is exposed and developed to uncover portions of the second protective layer 5 having a width A.

Figure 2:
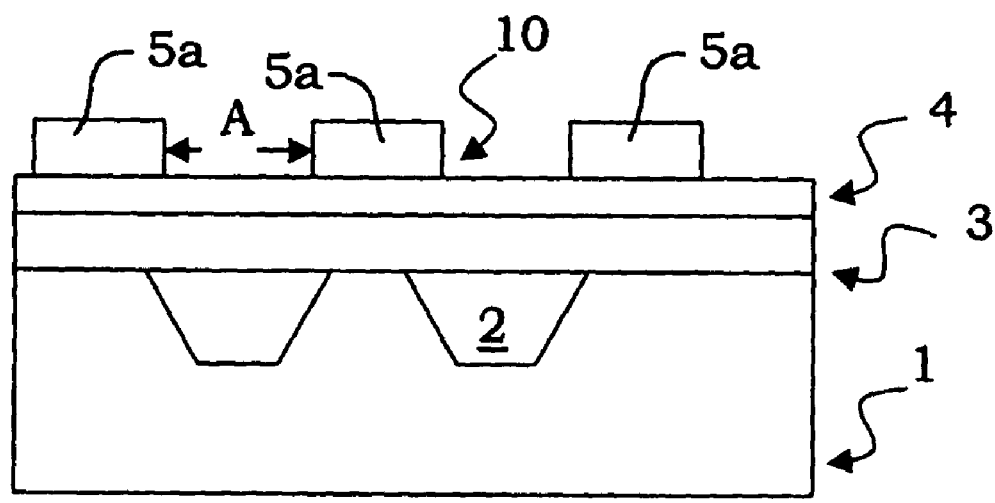

Lines 5a are defined by plasma etching in the second protective layer 5, which are mutually separated by first openings 10, having a width equal to the first width A. The photoresist layer 6 is then removed as shown in FIG. 2.

At this stage, spacers 8 are formed inside the first openings 10.

Figure 3:
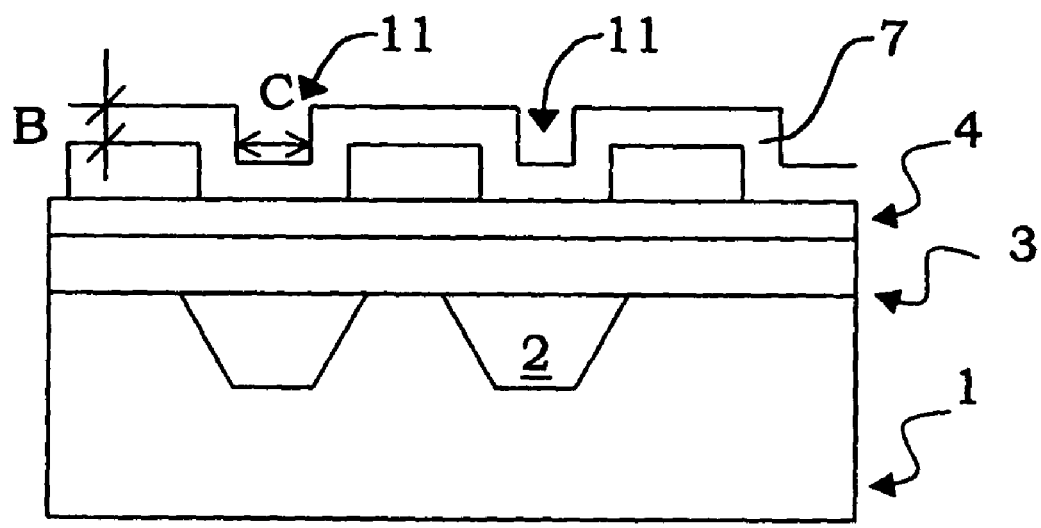
Figure 4:
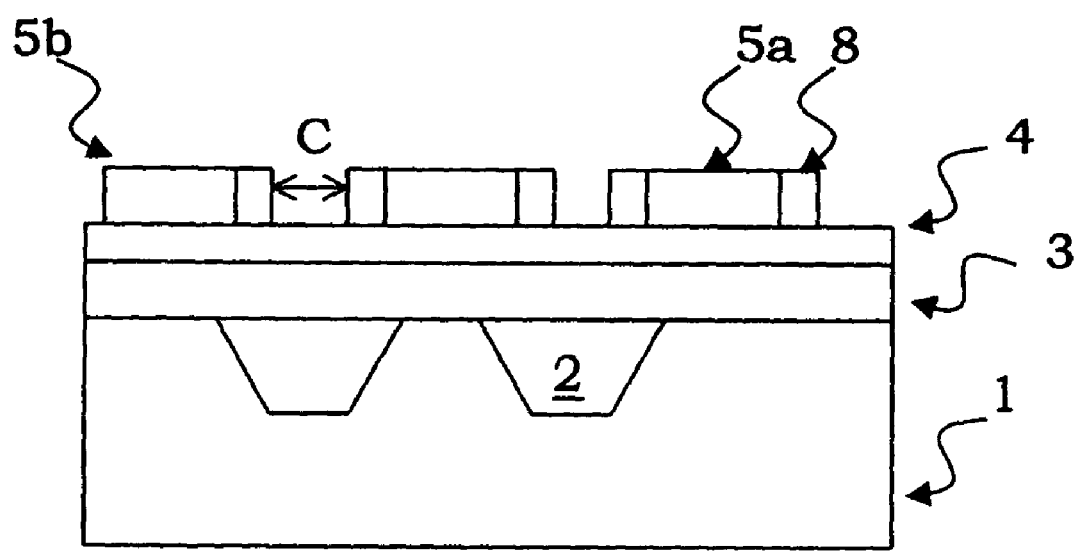

Advantageously, these spacers 8 are formed by first depositing a third protective layer 7, e.g. of the same material as the second protective layer 5, having a thickness B as shown in FIG. 3.

Spacers 8 of a protective material can be defined by a plasma etch. The structure comprising of the lines 5a and the spacers 8 provides a first mask 5b, wherein second openings 11 having a second width C=A−2B are defined.

By adjusting the thickness of the third protective layer 7, the width of the second openings 11 can be adjusted to far less than is allowed by conventional lithographic techniques.

Figure 5:
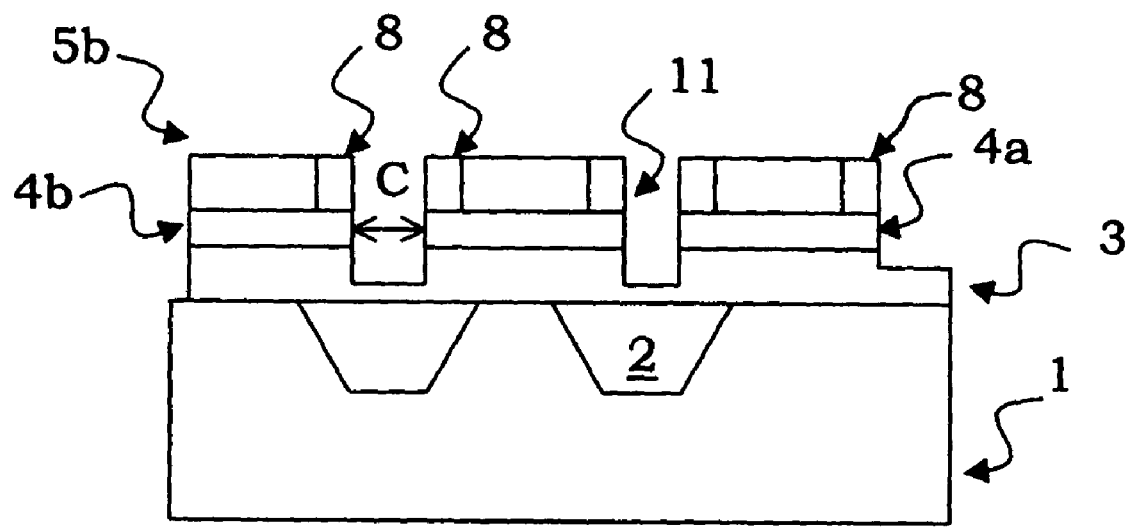

The first mask 5b of this invention is then used as a screen to fully etch and remove the first protective layer 4 aligned with of the openings 11, and partly remove the conductive layer 3 to leave it formed with grooves 13, as shown in FIG. 5.

Thereafter, the first mask 5b is removed by using conventional techniques like wet etching. Advantageously in this invention, the conductive layer 3 is not completely removed by the previous partial etch, so that it will be protecting the isolation regions 2 provided on the substrate 1 that otherwise would be damaged by the step of removing the first protective layer 4.

Figure 6:
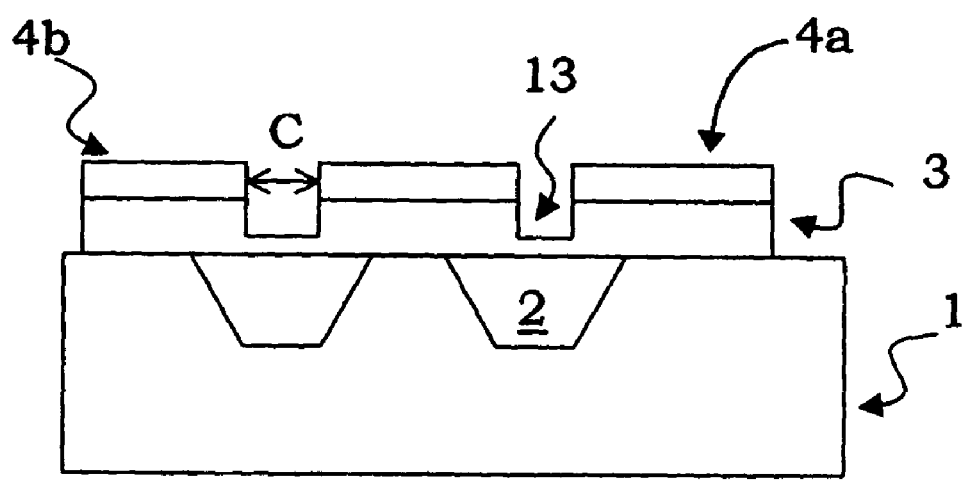

Thus, in the first protective layer 4, there are defined lines 4a at spacings of C as shown in FIG. 6. The lines 4a form a second mask 4b.

By etching the conductive layer 3 through the second mask 4b, the layer 3 etching step is completed. As a result, the conductive layer 3 has a plurality of conductive lines 3a patterned thereon.

Figure 7:
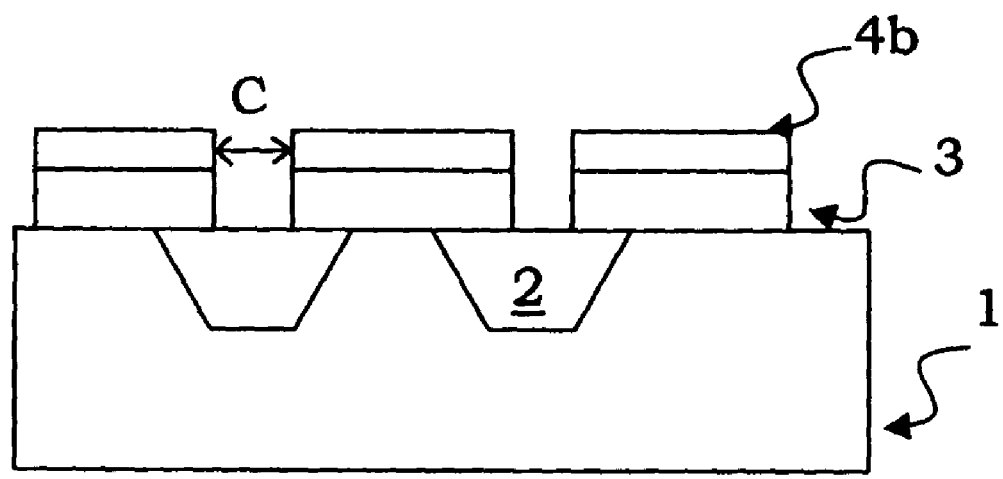

The second mask 4b comprises a material that is highly selective to the material of the isolation regions 2. Thus, the isolation regions 2 provided on the substrate 1 are safeguarded during the final etching of the conductive layer 3 as shown in FIG. 7.

Figure 8:
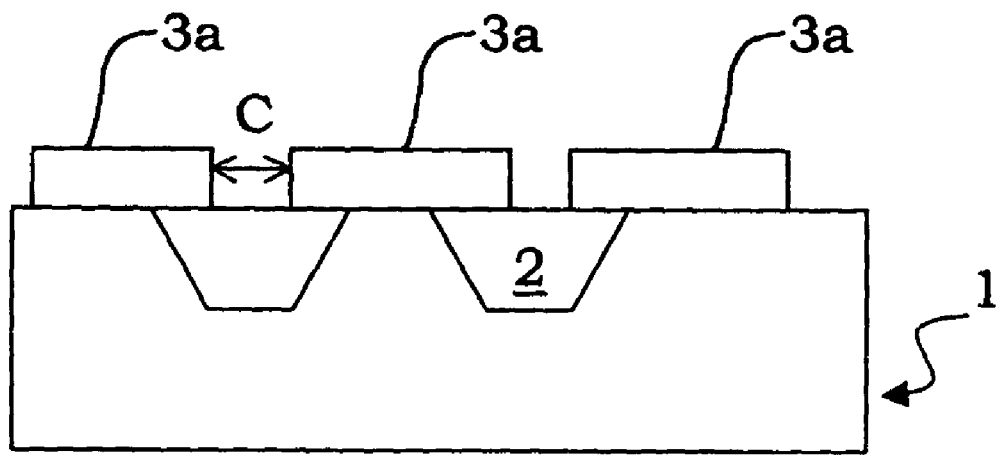

The process for defining closely spaced conductive lines 3a according to the invention is then completed with removing the first mask 4b that is selective to both the conductive layer 3 and the isolation regions 2, as shown in FIG. 8.

Figure 9:
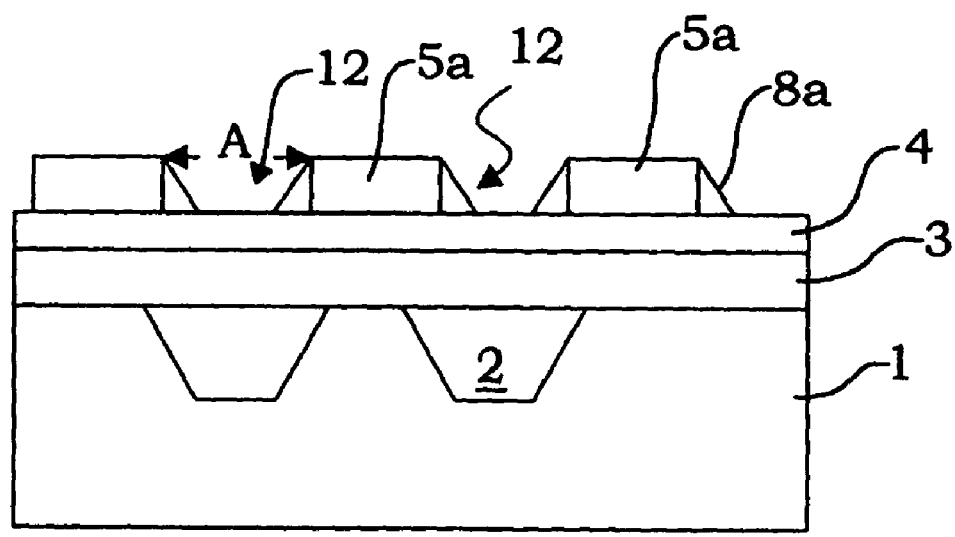
FIGS. 9 and 10 are schematic cross-section views of a portion of a circuit integrated at different steps of a modified embodiment of the manufacturing method according to the invention.
Figure 10:
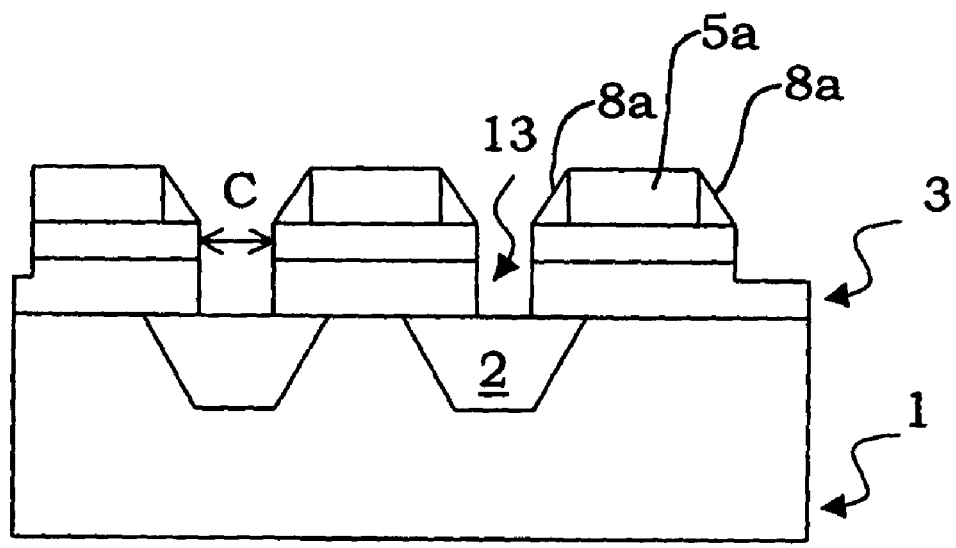

FIGS. 9 and 10 illustrate a modified embodiment of the manufacturing method according to this invention.

In particular, a conductive layer 3, a first protective layer 4 and a second layer 5, in this order, are formed on the semiconductor substrate 1. The second protective layer 5 is subjected to a polymerizing plasma etching step whereby openings 12, having sloping sidewalls, are formed as shown in FIG. 9.

A mask 5b is thus provided, wherein the vertical cross-section width of the opening 12 is not constant and decreases in a direction toward the first protective layer 4. Accordingly, the section of these openings 12 will pass from a first width A to a second width C, that is smaller than the first, close to the protective layer. This because the polymerizing etching step results in spacers 8a being formed within the opening 12 to provide it with flared sidewalls.

These spacers 8a are formed from the polymer material that is present in the polymerizing plasma employed to make the openings 12.

The process is then carried on through the steps previously described in relation to FIGS. 4 to 8, thereby producing the integrated structure shown in FIG. 10.

Summarizing, the method comprises using a double mask, comprising first and second overlaid masks 5b and 4b that are employed to pattern a conductive layer 3 on which they have been formed. The first protective mask 5b, made from a layer of an insulating material (e.g., silicon oxide), is formed with openings 11, 12 to uncover portions of the underlying layer which are smaller than those allowed by conventional photolithographic techniques.

The first mask 5b is employed to carry out an etching step of the second mask 4b beneath and a step of partly etching the conductive layer 3. Advantageously, the second mask 4b is made from a material of intermediate selectivity in comparison with the layers 5 and 3 in which it is formed.

The first mask 5b is then removed. The isolation regions 2 are undamaged by the removal of the first mask 5b because they are protected by the layer 3 of conductive material having only been removed in part by the previous etching step.

The second mask 4b is subsequently employed to just etch away the conductive layer 3 left over.

Advantageously, the thickness of the remaining conductive layer 3 can be controlled as desired such that a etch of high mask-to-layer selectivity will have no effect on the vertical opening profiles in the layer 3 of conductive material.

The above-described method suits especially the patterning of gate structures of a memory or transistors to provide a dimension pitch that is smaller than that defined by conventional photolithographic techniques. By using a double mask of an insulating material, in particular a dielectric material, a relatively simple and controllable process can be developed in order to define sub-lithographic pitches which will safeguard isolation structures previously formed in the wafer, such as interfacing oxides, isolation regions of the LOCOS and STI types, or any being defined.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claim is:

1. A method for manufacturing circuit structures integrated in a semiconductor substrate that includes isolation regions, the method comprising the steps of:
   depositing a conductive layer onto said semiconductor substrate;
   forming a first mask of a first material on said conductive layer;
   forming a second mask made of a second material that is different from the first material and provided with first openings of a first width having spacers formed on sidewalls of the first openings to uncover portions of said first mask having a second width which is smaller than the first width;

partly etching away said conductive layer through said first and second masks such to form grooves of said second width and leaving thin portions of said conductive layer covering said regions provided in said substrate;

removing said second mask and said spacers; and after removing said second mask and said spacers, etching said thin portions of said conductive layer through the grooves to uncover said regions provided in said substrate and form conductive lines from the conductive layer.

2. A method for manufacturing circuit structures according to claim 1, wherein said spacers are obtained by polymerizing plasma etching through said second mask.

3. A method for manufacturing circuit structures according to claim 1, wherein said first and second masks respectively are made of first and second protective layers.

4. A method for manufacturing circuit structures according to claim 3, wherein said first and second protective layers are made out of materials that are highly selectively etchable with respect to said conductive layer.

5. A method for manufacturing circuit structures according to claim 3, wherein said first and second protective layers are selectively etchable materials to each other.

6. A method for manufacturing circuit structures according to claim 3, wherein said first and second protective layers are dielectric layers.

7. A method for manufacturing circuit structures according to claim 6, wherein said first protective layer is a layer of silicon nitride.

8. A method for manufacturing circuit structures according to claim 6, wherein said second protective layer is a layer of silicon oxide.

9. A method for manufacturing circuit structures according to claim 3, wherein said spacers are formed by the following steps:

depositing a third protective layer onto said second mask after said openings are formed; and removing portions of said third protective layer to uncover portions of said first mask having a second width smaller than the first.

10. A method for manufacturing conductive lines, the method comprising:

forming a conductive layer;

forming a first protective layer of a first material on the conductive layer;

forming a second protective layer on the first protective layer, the second protective layer being of a second material that is different from the first material;

forming first openings of a first width in the second protective layer;

forming spacers on sidewalls of the first openings to reduce the first openings to a second width that is smaller than the first width;

etching, after forming the spacers, the first protective layer through the first openings in the second protective layer to produce second openings of the second width in the first protective layer without exposing a region underlying the conductive layer;

removing the spacers; and after removing the spacers, etching the conductive layer through the second openings in the first protective layer to produce third openings of the second width in the conductive layer and thereby form the conductive lines from the conductive layer.

11. The method of claim 10 wherein the first and second protective layers are made out of materials that are highly selectively etchable with respect to the conductive layer.

12. The method of claim 10 wherein the first and second protective layers are selectively etchable materials with respect to each other.

13. The method of claim 10 wherein the first and second protective layers are dielectric layers.

14. The method of claim 10 wherein the spacers are formed by the following steps:

depositing a third protective layer onto the second protective layer and into the first openings; and removing portions of the third protective layer outside of the first openings and portions of the third protective layer in central portions of the first openings while leaving portions of the third protective layer along the sidewalls of the first openings as the spacers.

15. The method of claim 10 wherein the spacers are obtained by polymerizing plasma etching of the second protective layer to produce the first openings.

16. The method of claim 10 wherein the first protective layer is a layer of silicon nitride.

17. The method of claim 16 wherein the second protective layer is a layer of silicon oxide.

18. A method, comprising:

forming a first layer;

forming a first protective layer of a first material on the first layer;

forming a second protective layer on the first protective layer, the second protective layer being of a second material that is different from the first material;

forming a first opening of a first width in the second protective layer;

forming spacers on sidewalls of the first opening to reduce the first opening to a second width that is smaller than the first width, wherein the forming spacers step uncovers a portion of the first protective layer having the second width, and wherein the spacers are obtained by polymerizing plasma etching of the second protective layer to produce the first opening;

etching the first protective layer through the first opening in the second protective layer to produce a second opening of the second width in the first protective layer; and etching the first layer through the second opening in the first protective layer to produce a third opening in the first layer.

19. The method of claim 18 wherein the first and second protective layers are made out of materials that are highly selectively etchable with respect to the first layer.

20. The method of claim 18 wherein the first and second protective layers are selectively etchable materials with respect to each other.

21. The method of claim 18 wherein the spacers are formed by the following steps:

depositing a third protective layer onto the second protective layer and into the first opening; and removing portions of the third protective layer outside of the first opening and a portion of the third protective layer in a central portion of the first opening while leaving portions of the third protective layer along the sidewalls of the first opening as the spacers.

22. A method for manufacturing conductive lines, the method comprising:

forming a conductive layer;

forming a first protective layer of a first material on the conductive layer;

forming a second protective layer on the first protective layer, the second protective layer being of a second material that is different from the first material, wherein the second protective layer is a layer of silicon oxide;

forming first openings of a first width in the second protective layer;

forming spacers on sidewalls of the first openings to reduce the first openings to a second width that is smaller than the first width;

etching the first protective layer through the first openings in the second protective layer to produce second openings of the second width in the first protective layer; and etching the conductive layer through the second openings in the first protective layer to produce third openings of the second width in the conductive layer and thereby form the conductive lines from the conductive layer.

23. The method of claim 22 wherein the first and second protective layers are made out of materials that are highly selectively etchable with respect to the conductive layer.

24. The method of claim 22 wherein the first and second protective layers are selectively etchable materials with respect to each other.

25. The method of claim 22 wherein the first and second protective layers are dielectric layers.

26. The method of claim 22 wherein the first protective layer is a layer of silicon nitride.

27. A method for manufacturing conductive lines, the method comprising:

forming a conductive layer;

forming a first protective layer of a first material on the conductive layer;

forming a second protective layer on the first protective layer, the second protective layer being of a second material that is different from the first material;

forming first openings of a first width in the second protective layer;

forming spacers on sidewalls of the first openings to reduce the first openings to a second width that is smaller than the first width, wherein the spacers are obtained by polymerizing plasma etching of the second protective layer to produce the first openings;

etching the first protective layer through the first openings in the second protective layer to produce second openings of the second width in the first protective layer; and etching the conductive layer through the second openings in the first protective layer to produce third openings of the second width in the conductive layer and thereby form the conductive lines from the conductive layer.

28. The method of claim 27 wherein the first and second protective layers are made out of materials that are highly selectively etchable with respect to the conductive layer.

29. The method of claim 27 wherein the first and second protective layers are selectively etchable materials with respect to each other.

30. The method of claim 27 wherein the first and second protective layers are dielectric layers.

31. The method of claim 27 wherein the first protective layer is a layer of silicon nitride.

32. A method for manufacturing circuit structures integrated in a semiconductor substrate that includes isolation regions, the method comprising the steps of:

depositing a conductive layer onto said semiconductor substrate;

forming a first mask of a first material on said conductive layer;

forming a second mask made of a second material that is different from the first material and provided with first openings of a first width having spacers formed on sidewalls of the first openings to uncover portions of said first mask having a second width which is smaller than the first width, wherein said first mask and said second mask are made out of materials that are highly selectively etchable with respect to said conductive layer;

partly etching away said conductive layer through said first and second masks such to form grooves of said second width;

removing said second mask and said spacers; and etching said grooves through said first mask to uncover said regions provided in said substrate and form conductive lines from the conductive layer.

33. The method of claim 32 wherein said first and second masks are made of first and second protective layers, respectively.

34. The method of claim 33 wherein said first and second protective layers are dielectric layers.

35. The method of claim 34 wherein said first protective layer is a layer of silicon nitride.

36. The method of claim 35 wherein said second protective layer is a layer of silicon oxide.

* * * * *